(12) United States Patent
Rathore et al.

(10) Patent No.: US 10,379,920 B2
(45) Date of Patent: Aug. 13, 2019

(54) PROCESSING DATA TO IMPROVE A QUALITY OF THE DATA

(71) Applicant: Accenture Global Solutions Limited, Dublin (IE)

(72) Inventors: Vijay Singh Rathore, Pune (IN); Suneet Kumar Garg, Mumbai (IN); Manisha Suri Sriraman, Bangalore (IN); Alok Johri, Mumbai (IN); Manoj Krishna, Bangalore (IN); Vasuprad Kanade, Pune (IN); Ayan Chakraborty, Kolkata (IN); Harsh H. Sharma, Florham Park, NJ (US); Shrikant Sarda, Pune (IN)

(73) Assignee: Accenture Global Solutions Limited, Dublin (IE)

( * ) Notice: Subject to any disclaimer, the term of this patent is extended or adjusted under 35 U.S.C. 154(b) by 215 days.

(21) Appl. No.: 15/674,235

(22) Filed: Aug. 10, 2017

(65) Prior Publication Data

US 2018/0373579 A1  Dec. 27, 2018

(30) Foreign Application Priority Data

Jun. 23, 2017 (IN) .............................. 201741022092

(51) Int. Cl.
| | |
|---|---|
| *G06F 11/00* | (2006.01) |
| *H03M 13/01* | (2006.01) |
| *G06F 17/18* | (2006.01) |
| *G06F 11/30* | (2006.01) |
| *G06N 20/00* | (2019.01) |
| *G06Q 10/00* | (2012.01) |
| *G06Q 10/06* | (2012.01) |

(52) U.S. Cl.
CPC ........ *G06F 11/006* (2013.01); *G06F 11/3082* (2013.01); *G06F 17/18* (2013.01); *G06N 20/00* (2019.01); *G06Q 10/00* (2013.01); *G06Q 10/06* (2013.01); *H03M 13/01* (2013.01); *G06F 2201/80* (2013.01)

(58) Field of Classification Search
CPC ................................. G06F 11/00; G06F 11/22
USPC ................................................... 714/25, 2, 1
See application file for complete search history.

(56) References Cited

U.S. PATENT DOCUMENTS

2013/0055042 A1   2/2013  Al Za'noun et al.

OTHER PUBLICATIONS

Informatica US, "Data Quality and Data Cleansing Products", https://www.informatica.com/products/data-quality.html#fbid=JYjdCSi1ALm, 2017, 8 pages.

(Continued)

*Primary Examiner* — Sarai E Butler
(74) *Attorney, Agent, or Firm* — Harrity & Harrity, LLP

(57) ABSTRACT

A first device may receive data from a set of second devices to be processed to determine a quality of the data. The data may include first data stored by the set of second devices, second data provided toward a third device, or third data related to fourth data. The first device may process the data using a first set of techniques to prepare the data for processing. The first device may process the data using a second set of techniques to improve the quality of the data and to form processed data. The first device may provide the processed data toward the set of second devices to replace the data stored by the set of second devices to permit the set of second devices to use the processed data. The first device may perform an action after providing the processed data toward the set of second devices.

20 Claims, 7 Drawing Sheets

(56) References Cited

OTHER PUBLICATIONS

IBM Analytics, "InfoSphere Information Server", https://www.ibm.com/analytics/us/en/technology/information-server/, Jan. 30, 2017, 11 pages.
Talend,"Talend Data Integration", https://www.talend.com/, 2017, 7 pages.

PROCESSING DATA TO IMPROVE A QUALITY OF THE DATA

RELATED APPLICATION

This application claims priority under 35 U.S.C. § 119 to Indian Patent Application No. 201741022092, filed on Jun. 23, 2017, the content of which is incorporated by reference herein in its entirety.

BACKGROUND

Data quality may refer to a condition of data in terms of its fitness for intended uses of the data (e.g., operations, decision making, etc.), an extent to which the data correctly represents a real-world construct to which the data refers, and/or the like. Data quality may relate to accuracy of data, consistency of data, completeness of data, and/or the like. Data quality may impact uses of data. For example, poor data quality (e.g., data that contains errors) may negatively impact use of the data.

SUMMARY

According to some possible implementations, a first device may include one or more processors to receive data from a set of second devices to be processed to determine a quality of the data. The data may include first data stored by the set of second devices, second data provided toward a third device, or third data related to fourth data. The one or more processors may process the data using a first set of techniques to prepare the data for processing related to improving the quality of the data. The one or more processors may process the data using a second set of techniques to improve the quality of the data and to form processed data. The processed data may be used or stored by the set of second devices. The one or more processors may provide the processed data toward the set of second devices to replace the data stored by the set of second devices or toward another destination to permit the set of second devices or the other destination to use the processed data. The processed data may be provided toward the set of second devices to improve the quality of the data stored by the set of second devices. The one or more processors may perform an action after providing the processed data toward the set of second devices or the other destination.

According to some possible implementations, a method may include receiving, by a first device, data from a set of second devices to be processed to determine whether the data includes an error. The data may include first data stored by the set of second devices, second data provided toward a third device, or third data related to fourth data. The method may include processing, by the first device, the data using a first set of techniques to prepare the data for processing related to determining whether the data includes the error. The method may include processing, by the first device, the data using a second set of techniques to positively impact the error and to form processed data. The processed data may be used or stored by the set of second devices. The method may include providing, by the first device, the processed data toward the set of second devices to positively impact the error by replacing the data stored in the set of second devices or toward another destination to permit the set of second devices or the other destination to use the processed data. The method may include performing, by the first device, an action after providing the processed data toward the set of second devices or the other destination.

According to some possible implementations, a non-transitory computer-readable medium may store one or more instructions that, when executed by one or more processors, cause the one or more processors to receive data from a set of first devices. The data may be processed to determine whether the data includes an error. The one or more instructions, when executed by the one or more processors, may cause the one or more processors to process the data using a first set of techniques to permit a second device to determine whether the data includes the error. The one or more instructions, when executed by the one or more processors, may cause the one or more processors to process the data using a second set of techniques related to determining whether the data includes the error. The second set of techniques may be used to form processed data. The one or more instructions, when executed by the one or more processors, may cause the one or more processors to determine whether the data includes the error based on a result of processing the data using the second set of techniques. The one or more instructions, when executed by the one or more processors, may cause the one or more processors to provide the processed data toward the set of first devices to replace the data stored by the set of first devices or toward another destination. The processed data may be provided toward the set of first devices to positively impact the error included in the data. The one or more instructions, when executed by the one or more processors, may cause the one or more processors to perform an action after providing the processed data toward the set of first devices or the other destination.

DETAILED DESCRIPTION

The following detailed description of example implementations refers to the accompanying drawings. The same reference numbers in different drawings may identify the same or similar elements.

An organization may be experiencing a data quality problem. For example, data that the organization uses may be corrupted, may be inconsistent across different data sources, may include duplicate data, and/or the like. This may cause errors when using the data, such as when using the data to generate a report, to implement a particular process (e.g., transaction processing), and/or the like. Further, although the organization may fix a data quality problem on data that has been received from a data source (e.g., a system), the organization may lack a computer-based technique for updating the data at the source of the data. This consumes processing resources of hardware resources of the organization via fixing the data each time the data is received from a source. In addition, this reduces an efficiency of using the data by increasing an amount of time between when data is received from a source and when the data can be used.

Some implementations, described herein, provide a data quality system that is capable of receiving data from a source (e.g., a system), fixing a data quality problem associated with the data, and replacing data in the source with the fixed data. In this way, the data quality system may update data at a source of the data so that the data does not need to be fixed each time the data is used. This conserves processing resources of hardware resources of an organization by reducing or eliminating a need to fix the data each time the data is used. In addition, this conserves processing resources of hardware resources that use the data by reducing or eliminating errors during use of the data that would otherwise consume processing resources through the use of error-containing data, that would otherwise be consumed reprocessing data because of processing errors that resulted from using error-containing data, and/or the like. Further, this increases an efficiency of using data from a source by reducing an amount of time between when the data is received from the source and when the data can be used (e.g., to generate a report, to implement a particular process, etc.).

Figure 1A:
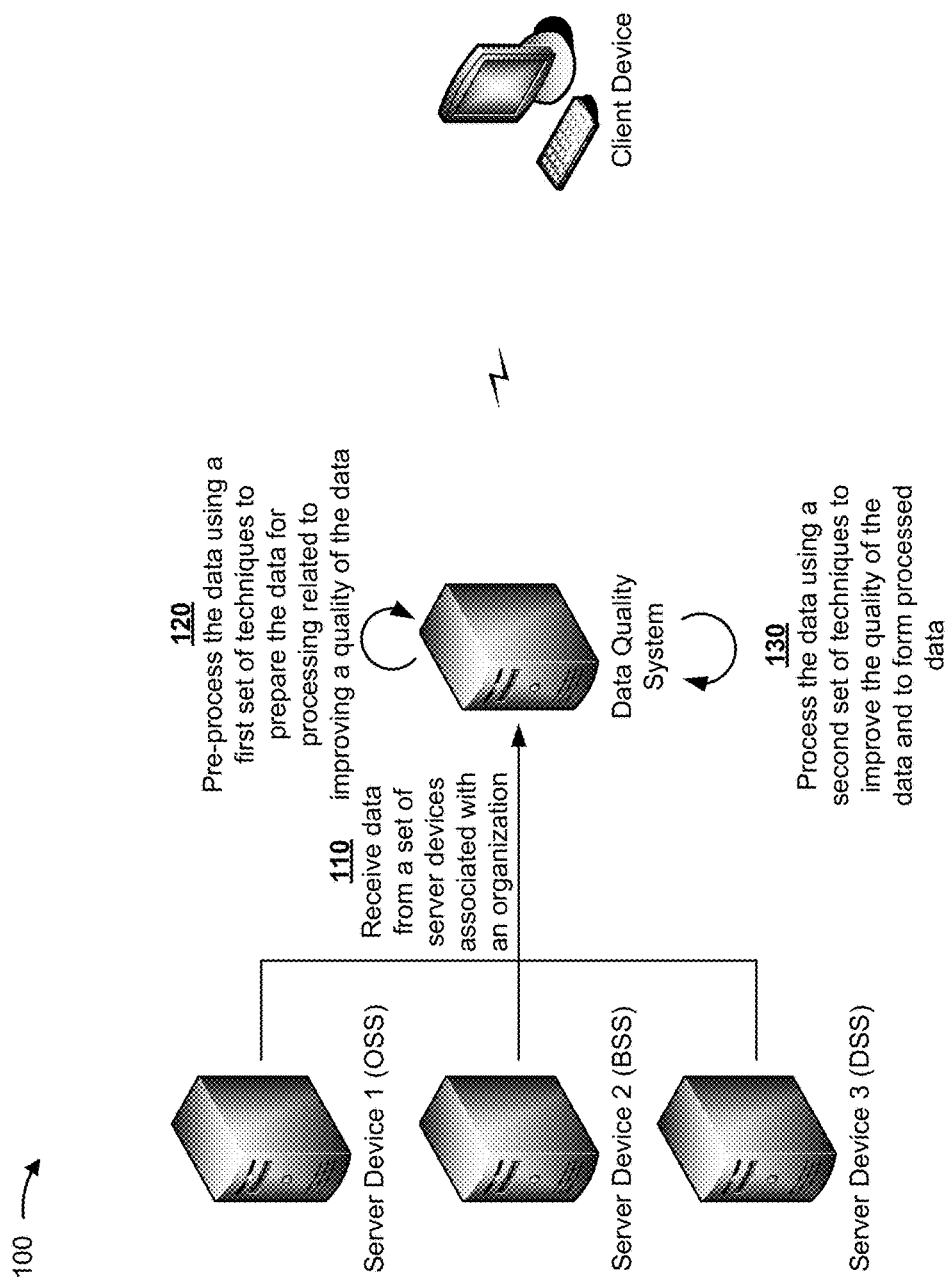
FIGS. 1A and 1B are diagrams of an overview of an example implementation described herein.
Figure 1B:
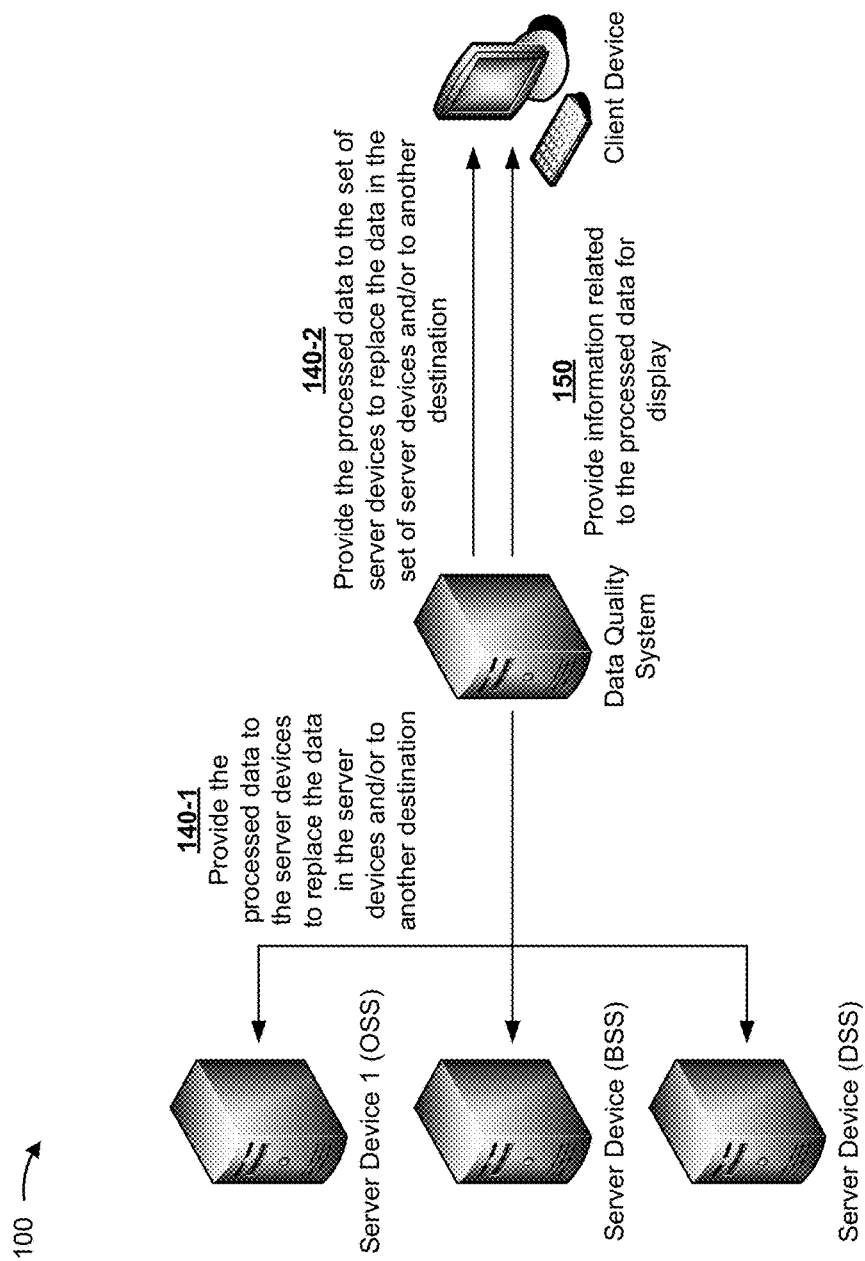

FIGS. 1A and 1B are diagrams of an overview of an example implementation 100 described herein. As shown in FIGS. 1A and 1B, example implementation 100 may include server devices 1 through 3 associated with various systems (e.g., shown as an operations support system (OSS), a business support system (BSS), and a decision support system (DSS)), a data quality system, and a client device. Although example implementation 100 shows three different server devices and a single client device, in practice, there may be hundreds, thousands, millions, etc. of server devices and/or client devices.

As shown in FIG. 1A, and as shown by reference number 110, the data quality system may receive data from a set of server devices (e.g., systems) associated with an organization. For example, the data quality system may receive the data from server devices 1 through 3 associated with an OSS, a BSS, and a DSS. When receiving the data, the data quality system may receive thousands, millions, billions, etc. of data elements, thereby receiving a data set that cannot be processed manually or objectively by a human actor. In some implementations, the data may include idle data stored in server devices 1 through 3, data being provided from a source to a destination (e.g., from server devices 1 through 3 to an application being accessed via the client device), metadata associated with other data, and/or the like. In some implementations, the data quality system may receive the data periodically, according to a schedule, based on requesting the data, and/or the like.

As further shown in FIG. 1A, and by reference number 120, the data quality system may pre-process the data using a first set of techniques to prepare the data for processing related to improving a quality of the data. For example, the data quality system may aggregate data from different server devices, deduplicate data, apply a standard formatting to data, obtain the same data stored in other sources (e.g., to permit checking of consistency across multiple server devices), and/or the like. Pre-processing the data may modify the data to be in a form that permits the data quality system to process the same data from different sources and/or with different formatting, to identify an error associated with the data, and/or the like. When pre-processing the data, the data quality system may pre-process thousands, millions, billions, etc. of data elements from hundreds, thousands, etc. of server devices, thereby processing a data set that cannot be processed manually or objectively by a human actor.

As further shown in FIG. 1A, and by reference number 130, the data quality system may process the data using a second set of techniques to improve the quality of the data and to form processed data. For example, the data quality system may process the data using a set of rules (e.g., a set of rules related to hardware resources that are to use the data, industry standards, data governance rules, etc.). The set of rules may be based on an intended use of the data, a source of the data, a destination of the data, and/or the like.

The data quality system may process the data using machine learning. For example, the data quality system may use machine learning to identify errors associated with the data. In this case, the data quality system may have been trained on data intended for the same use as the data being processed, data from the same source as the data being processed, data associated with the same destination as the data being processed, and/or the like. In this way, the data quality system may automatically identify an error related to data based on being trained on other data.

The data quality system may identify values for a set of metrics based on the data. For example, the set of metrics may relate to a quantity of data sets received, a quantity of data sets with complete data or properly formatted data, a quantity of data sets that include null values, and/or the like. The data quality system may determine the set of metrics to use from the same information that identifies the set of rules (e.g., an industry standard, data governance rules, etc.).

When processing the data using the second set of techniques, the data quality system may fix errors identified in the data (e.g., positively impact the error, improve a quality of the data, etc.). For example, the data quality system may format the data, complete the data (e.g., by inputting a value into the data, requesting a data element from another source, etc.), and/or the like. The data quality system may fix errors in a particular manner for an intended use of the data, to satisfy a set of rules, to match other data with the same intended use, and/or the like. In some cases, the data quality system may output, for display via the client device, a report that indicates proposed modifications to the data and may request approval from a user of the client device prior to fixing errors related to the data.

As shown in FIG. 1B, and as shown by reference number 140-1 and 140-2, the data quality system may provide the processed data to the server devices (e.g., server devices 1 through 3) to replace the data in the server devices and/or may provide the processed data to another destination. For example, the data quality system may provide the data to server devices 1 through 3 associated with the various systems (e.g., to replace the data stored by server devices 1 through 3), such as when the data that the data quality system processed was idle data. As another example, the data quality system may provide the data to the client device (e.g., for display, to an application installed on, executing on, or being accessed via the client device, etc.), such as when the data quality system processes data being provided toward a destination. In this way, the data quality system may automatically replace error-containing data stored in the set of server devices with fixed data.

As further shown in FIG. 1B, and as shown by reference number 150, the data quality system may provide information related to the processed data for display. For example, the data quality system may provide a report for display that indicates a manner in which data was modified, sources for which stored data was replaced, destinations to which the data was provided, and/or the like.

In this way, the data quality system may update data at a source of the data so that the data does not need to be fixed each time the data is used. This conserves processing resources of hardware resources of an organization by reducing or eliminating a need to fix the data each time the data is used. In addition, this conserves processing resources of hardware resources that use the data by reducing or eliminating errors during use of the data that would otherwise consume processing resources through use of error-containing data, that would otherwise be consumed reprocessing data because of processing errors that resulted from using error-containing data, and/or the like. Further, this increases an efficiency of using data from a source by reducing an amount of time between when data is received from the source and when the data can be used (e.g., to generate a report, to implement a particular process, etc.).

As indicated above, FIGS. 1A and 1B are provided merely as an example. Other examples are possible and may differ from what was described with regard to FIGS. 1A and 1B.

Figure 2:
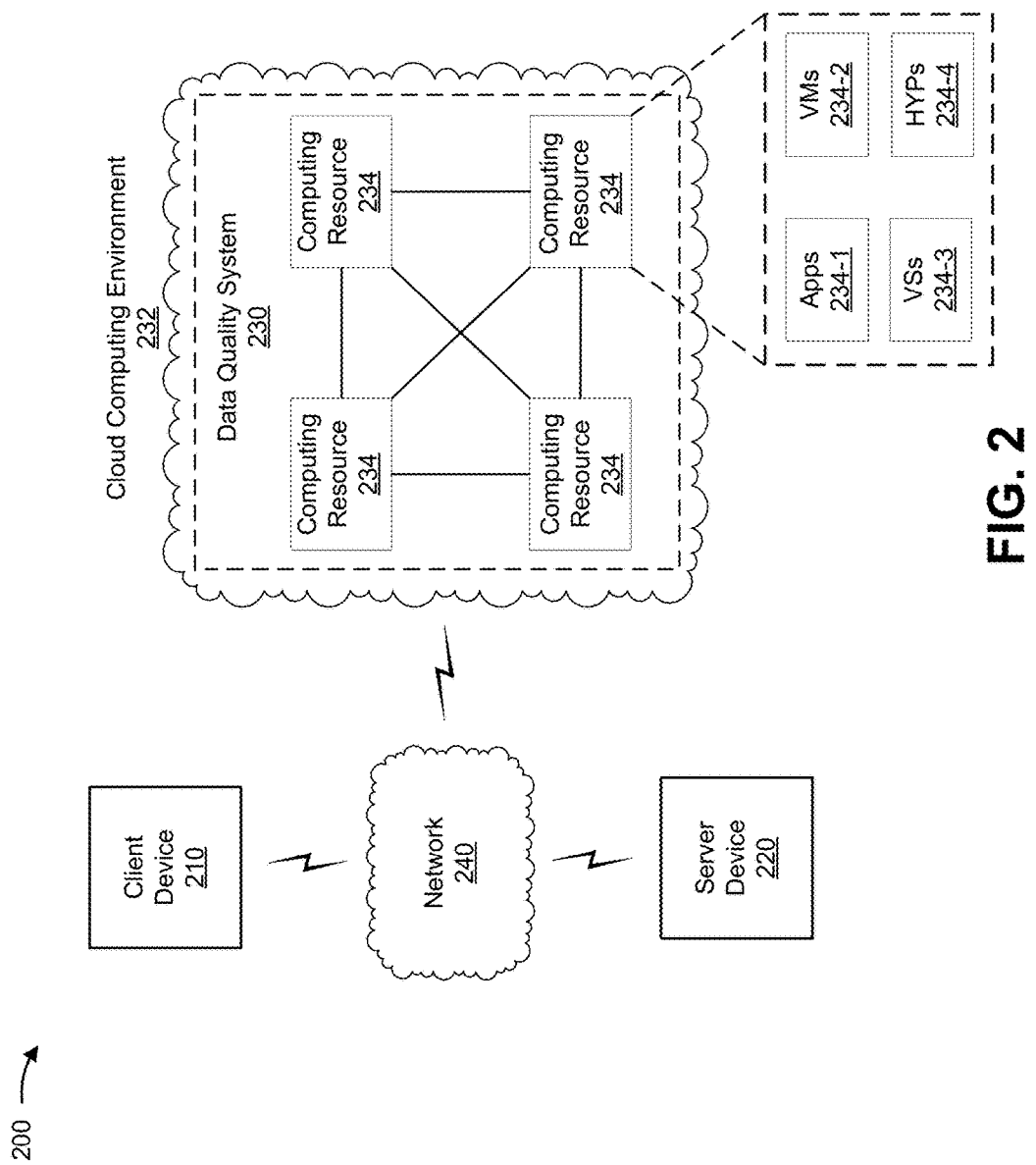
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include client device 210, server device 220, data quality system 230, cloud computing environment 232, and a set of computing resources 234. Devices of environment 200 may interconnect via wired connections, wireless connections, or a combination of wired and wireless connections.

Client device 210 includes one or more devices capable of receiving, generating, storing, processing, and/or providing information associated with data that is processed to determine a quality of the data. For example, client device 210 may include a desktop computer, a mobile phone (e.g., a smart phone or a radiotelephone), a laptop computer, a tablet computer, a gaming device, a wearable communication device (e.g., a smart wristwatch or a pair of smart eyeglasses), a navigation device (e.g., a global positioning system (GPS) navigation device), or a similar type of device. In some implementations, client device 210 may receive information identifying a result of processing data to determine a quality of the data, as described elsewhere herein. Additionally, or alternatively, client device 210 may provide the result for display, as described elsewhere herein. Although FIG. 2 shows a single client device 210, in practice, there may be thousands, millions, billions, etc. of client devices 210 in communication with data quality system 230, as described elsewhere herein.

Server device 220 includes one or more devices capable of receiving, generating, storing, processing, and/or providing information associated with data that is processed to determine a quality of the data. For example, server device 220 may include a server (e.g., in a data center or a cloud computing environment), a data center (e.g., a multi-server micro data center), a workstation computer, a virtual machine (VM) provided in a cloud computing environment, or a similar type of device. In some implementations, server device 220 may provide, to data quality system 230, data to be processed to determine a quality of the data, as described elsewhere herein. Additionally, or alternatively, server device 220 may receive processed data from data quality system 230, as described elsewhere herein. Although a single server device 220 is shown in FIG. 2, in practice, there can be thousands, millions, billions, etc. of server devices 220 in communication with data quality system 230.

Data quality system 230 includes one or more devices capable of processing data to improve a quality of the data.

For example, data quality system 230 may include a cloud server or a group of cloud servers. In some implementations, data quality system 230 may be designed to be modular such that certain software components can be swapped in or out depending on a particular need. As such, data quality system 230 may be easily and/or quickly reconfigured for different uses.

In some implementations, as shown, data quality system 230 may be hosted in cloud computing environment 232. Notably, while implementations described herein describe data quality system 230 as being hosted in cloud computing environment 232, in some implementations, data quality system 230 may not be cloud-based (i.e., may be implemented outside of a cloud computing environment) or may be partially cloud-based.

Cloud computing environment 232 includes an environment that hosts data quality system 230. Cloud computing environment 232 may provide computation, software, data access, storage, and/or other services that do not require end-user knowledge of a physical location and configuration of a system and/or a device that hosts data quality system 230. As shown, cloud computing environment 232 may include a group of computing resources 234 (referred to collectively as "computing resources 234" and individually as "computing resource 234").

Computing resource 234 includes one or more personal computers, workstation computers, server devices, or another type of computation and/or communication device. In some implementations, computing resource 234 may host data quality system 230. The cloud resources may include compute instances executing in computing resource 234, storage devices provided in computing resource 234, data transfer devices provided by computing resource 234, etc. In some implementations, computing resource 234 may communicate with other computing resources 234 via wired connections, wireless connections, or a combination of wired and wireless connections.

As further shown in FIG. 2, computing resource 234 may include a group of cloud resources, such as one or more applications ("APPs") 234-1, one or more virtual machines ("VMs") 234-2, one or more virtualized storages ("VSs") 234-3, or one or more hypervisors ("HYPs") 234-4.

Application 234-1 includes one or more software applications that may be provided to or accessed by one or more devices of environment 200. Application 234-1 may eliminate a need to install and execute the software applications on devices of environment 200. For example, application 234-1 may include software associated with data quality system 230 and/or any other software capable of being provided via cloud computing environment 232. In some implementations, one application 234-1 may send/receive information to/from one or more other applications 234-1, via virtual machine 234-2.

Virtual machine 234-2 includes a software implementation of a machine (e.g., a computer) that executes programs like a physical machine. Virtual machine 234-2 may be either a system virtual machine or a process virtual machine, depending upon use and degree of correspondence to any real machine by virtual machine 234-2. A system virtual machine may provide a complete system platform that supports execution of a complete operating system ("OS"). A process virtual machine may execute a single program, and may support a single process. In some implementations, virtual machine 234-2 may execute on behalf of a user (e.g., a user of client device 210), and may manage infrastructure of cloud computing environment 232, such as data management, synchronization, or long-duration data transfers.

Virtualized storage 234-3 includes one or more storage systems and/or one or more devices that use virtualization techniques within the storage systems or devices of computing resource 234. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

Hypervisor 234-4 provides hardware virtualization techniques that allow multiple operating systems (e.g., "guest operating systems") to execute concurrently on a host computer, such as computing resource 234. Hypervisor 234-4 may present a virtual operating platform to the guest operating systems, and may manage the execution of the guest operating systems. Multiple instances of a variety of operating systems may share virtualized hardware resources.

Network 240 includes one or more wired and/or wireless networks. For example, network 240 may include a cellular network (e.g., a long-term evolution (LTE) network, a code division multiple access (CDMA) network, a 3G network, a 4G network, a 5G network, or another type of cellular network), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, and/or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
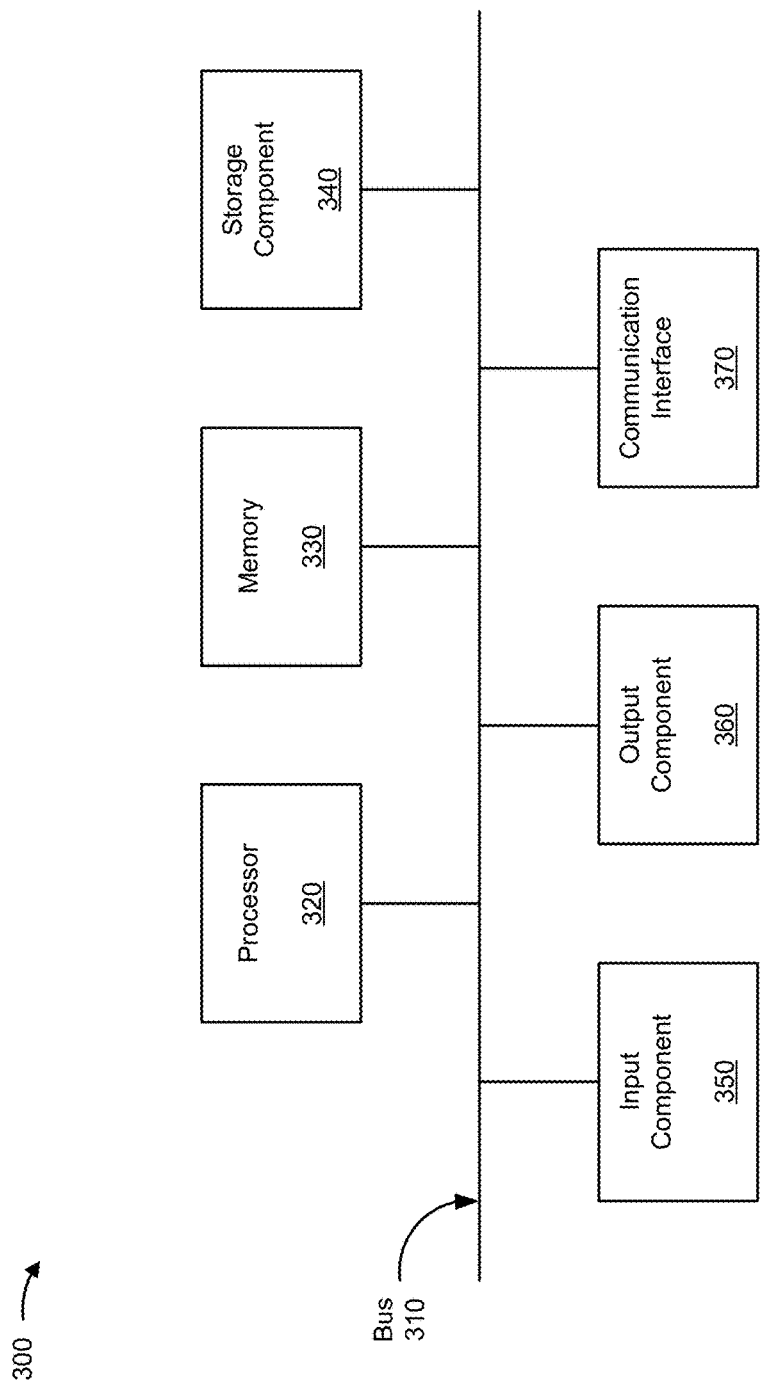
FIG. 3 is a diagram of example components of one or more devices of FIG. 2.

FIG. 3 is a diagram of example components of a device 300. Device 300 may correspond to client device 210, server device 220, and/or data quality system 230. In some implementations, client device 210, server device 220, and/or data quality system 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 includes a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operations and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes based on processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
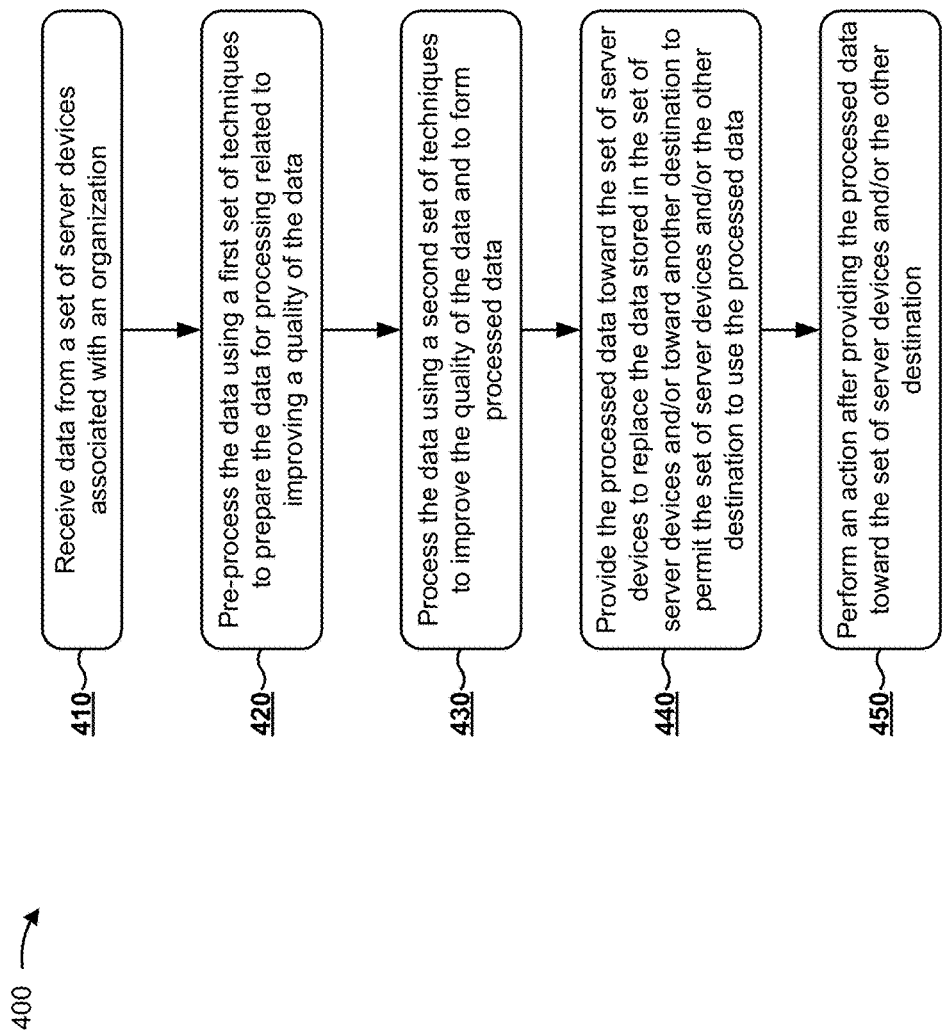
FIG. 4 is a flow chart of an example process for processing data to improve a quality of the data.

FIG. 4 is a flow chart of an example process 400 for processing data to improve a quality of the data. In some implementations, one or more process blocks of FIG. 4 may be performed by data quality system 230. In some implementations, one or more process blocks of FIG. 4 may be performed by another device or a group of devices separate from or including data quality system 230, such as client device 210 and/or server device 220.

As shown in FIG. 4, process 400 may include receiving data from a set of server devices associated with an organization (block 410). For example, data quality system 230 may receive data from a set of server devices 220 (e.g., that host various systems) associated with an organization. In some implementations, data quality system 230 may receive the data periodically, according to a schedule, based on requesting the data, as the data is provided from a source of the data toward a destination (e.g., from server device 220 toward an application and/or client device 210), and/or the like. In some implementations, data quality system 230 may receive thousands, millions, billions, etc. of data elements when receiving data from server device 220. In this way, data quality system 230 may receive a data set that cannot be processed manually or objectively by a human actor.

In some implementations, the data may include data stored in a source of the data (e.g., in server device 220 associated with a system). Additionally, or alternatively, the data may include data stored in a destination of the data (e.g., server device 220 associated with an application that provides a user of the application with access to the data, client device 210, etc.). Additionally, or alternatively, the data may include data being provided from a source of the data toward a destination of the data.

In some implementations, server device 220 and/or client device 210 that provides the data may be associated with a system. For example, a system may be used to perform a function and/or provide a service for the organization. In some implementations, and for example, a system may include an operations support system (OSS), a business support system (BSS), and/or a decision support system (DSS) that provides services related to functions of an organization such as inventory management, transaction processing, report generation, decision making, and/or the like. In some implementations, a system may be hosted by a set of server devices 220 and/or a set of client devices 210.

In some implementations, data quality system 230 may monitor a performance of a set of systems to detect an error related to use of data by the set of systems. For example, data quality system 230 may detect an error when a user uses the set of systems to generate the same report multiple times in a threshold amount of time (e.g., indicating the user identified an error with the report), when a user spends a threshold amount of time generating a report or fixing data (e.g., based on time entry logs), when the set of systems generates an error report during operations of the set of systems, based on a threshold score received from a user that indicates an accuracy of output from the set of systems, and/or the like. In some implementations, data quality system 230 may receive the data based on requesting the data from the set of systems when data quality system 230 detects an error, based on the set of systems automatically providing the data when an error occurs, and/or the like.

In some implementations, data quality system 230 may receive the data in a file. For example, data quality system 230 may receive the data in a comma separated values (CSV) file, a spreadsheet file, a text file, and/or the like. In this way, data quality system 230 may receive various types of files, thereby increasing a capability of data quality system 230 to process data from different sources.

In this way, data quality system 230 may receive data from a set of server devices 220 associated with an organization to permit data quality system 230 to pre-process the data using a first set of techniques to prepare the data for other processing.

As further shown in FIG. 4, process 400 may include pre-processing the data using a first set of techniques to prepare the data for processing related to improving a quality of the data (block 420). For example, data quality system 230 may pre-process the data using a first set of techniques to prepare the data for processing related to improving a quality of the data. In some implementations, pre-processing the data may modify the data to be in a form that data quality system 230 can use to perform an analysis of a quality of the data. This improves an accuracy of analyzing a quality of the data by reducing or eliminating errors that may result from differently formatted data, data that is in a format that data quality system 230 cannot process, and/or the like.

In some implementations, pre-processing data may include pre-processing thousands, millions, billions, etc. of data elements. In this way, data quality system 230 may pre-process a data set that cannot be processed manually or objectively by a human actor.

In some implementations, the first set of techniques may include aggregating data from multiple sources (e.g., aggregating data from multiple server devices 220, multiple systems associated with multiple server devices 220, etc.). Additionally, or alternatively, the first set of techniques may include deduplicating data. Additionally, or alternatively, the first set of techniques may include applying a particular, or standard, formatting to the data. Additionally, or alternatively, the first set of techniques may include removing corrupted data elements from the data and obtaining replacement data for the corrupted data elements (e.g., fixing corrupted data elements included in the data).

In some implementations, and as a specific example, data quality system 230 may pre-process data based on an intended use of the data. For example, data quality system 230 may aggregate data based on a granularity of the data for an intended use. Continuing with the previous example, data quality system 230 may aggregate data related to multiple customers of the organization when the intended use of data relates to analyzing averages or per customer data (e.g., where a threshold granularity is not needed). Conversely, data quality system 230 may not aggregate customer data when the intended use of the data is to identify particular customers where values of particular data satisfy a threshold (e.g., where a threshold granularity is needed).

Additionally, or alternatively, as another example, different intended uses of data may permit different formats, use of corrupted data, and/or the like. Continuing with the previous example, data quality system 230 may determine whether particular techniques of the first set of techniques need to be performed based on an intended use of the data and may determine to not perform the particular techniques based on the intended use of the data. This conserves processing resources of data quality system 230 by reducing a quantity of operations that data quality system 230 has to perform.

In this way, data quality system 230 may pre-process the data using a first set of techniques to prepare the data for processing related to improving a quality of the data.

As further shown in FIG. 4, process 400 may include processing the data using a second set of techniques to improve the quality of the data and to form processed data (block 430). For example, data quality system 230 may process the data using a second set of techniques to improve the quality of the data and to form processed data. In some implementations, data quality system 230 may process the data using a second set of techniques after processing the data using a first set of techniques (e.g., described with respect to block 420). In some implementations, data quality system 230 may process the data using a second set of techniques to modify the data such that the data can be used for a particular use or in a particular manner. Additionally, or alternatively, data quality system 230 may process data using the second set of techniques to determine whether the data includes an error (e.g., based on a result of processing the data using the second set of techniques), as described in more detail elsewhere herein.

In some implementations, when processing the data using a second set of techniques, data quality system 230 may process thousands, millions, billions, etc. of data elements. In this way, data quality system 230 may process a data set that cannot be processed manually or objectively by a human actor.

In some implementations, the second set of techniques may include processing the data using a set of rules to determine whether the data satisfies the set of rules. For example, the set of rules may relate to hardware resources that are to use the data, industry standards related to the data, data governance rules related to the data and/or an organization, a particular manner in which data can be used, and/or the like. Additionally, or alternatively, and as another example, the set of rules may be based on an intended use of the data, a source of the data, a destination of the data, and/or the like. For example, data quality system 230 may identify a set of rules based on information identifying a source of the data, a destination of the data, an intended use of the data, and/or the like. In some implementations, data quality system 230 may identify an error related to the data when the data fails to satisfy a set of rules (e.g., when a threshold quantity of data elements in the data fails to satisfy a set of rules).

In some implementations, data quality system 230 may determine a set of rules by processing other data. For example, data quality system 230 may process text (e.g., a document, a webpage, a text file, etc.) using natural language processing, computational linguistics, text analysis, and/or the like to identify a term and/or phrase included in the text that identifies a set of rules.

In some implementations, data quality system 230 may identify a set of rules using machine learning. For example, data quality system 230 may identify a set of rules to use by processing the data, information identifying a source, destination, use, etc. of the data, and/or the like, using machine learning where data quality system 230 has been trained on information identifying different data sets, sources, destinations, uses, and/or the like and corresponding sets of rules.

In some implementations, data quality system 230 may determine a profile of the data prior to determining a set of rules to use to process the data. For example, data quality system 230 may process other data stored by server device 220 from which the data was received, to which the data is destined, and/or the like to determine a profile of the data and/or to determine a set of rules that may apply to the data. Continuing with the previous example, data quality system 230 may process information identifying a user interaction with the data (e.g., a manner in which a user interacts with the data), a topic or domain with which the data is associated, and/or the like, to determine a profile of the data and/or a set of rules that may apply to the data. In some implementations, when determining a profile of the data, data quality system 230 may determine a percentage of data elements that have a value, a quantity of unique values for data elements of the data, a distribution of values for data elements of the data, a range of values for data elements of the data, a pattern of values or formats for the data, and/or the like.

In some implementations, the second set of techniques may include processing the data using machine learning to determine whether the data contains an error and/or to determine a quality of the data. For example, data quality system 230 may process the data to identify patterns among the data elements, such as patterns related to values of the data, types of data elements included in the data (e.g., user account data elements, metrics to which the data elements relate, etc.), and/or the like. Continuing with the previous example, data quality system 230 may identify an error related to the data based on patterns identified for the data using machine learning. In some implementations, data quality system 230 may have been trained on data for an intended use. For example, data quality system 230 may process the data using machine learning to predict an intended use of the data and may then identify errors in the data based on the predicted intended use. In some implementations, data quality system 230 may determine a score for multiple predicted uses of the data and may select an intended used with the highest score relative to other scores, based on an intended use having a threshold score, and/or the like.

In some implementations, when using machine learning, data quality system 230 may use a variety of types of machine learning. For example, data quality system 230 may use supervised machine learning, unsupervised machine learning, manual review of a quality of data (e.g., by a user of client device 210), and/or the like.

In some implementations, the second set of techniques may include processing the data to determine values for a set of metrics. For example, the set of metrics may include a quantity of data sets received, a quantity of data sets with complete data or properly formatted data for a particular use, a quantity of data sets that include null values, a quantity of data type violations (e.g., data as a string type rather than a number type), a quantity of format violations (e.g., data identifying a year in two-digit format rather than four-digit format), whether the data includes missing data, whether the data includes minimum and/or maximum value violations, whether the data includes duplicate values, whether the data violates a set of rules, and/or the like. In some implementations, the metrics may be based on a set of rules used to process the data. For example, a first set of metrics may be associated with a first set of rules and a second set of metrics may be associated with a second set of rules. Additionally, or alternatively, a set of metrics may be associated with an intended use of the data.

In some implementations, data quality system 230 may use a set of metrics to determine whether the data includes an error, whether the data violates a set of rules, and/or the like (e.g., where a value for a particular metric satisfies a threshold, when a threshold quantity of metrics have threshold values, etc.). In some implementations, data quality system 230 may determine a quality of the data based on values of a set of metrics related to the data, whether data quality system 230 determines values for particular combinations of metrics based on processing the data, and/or the like. For example, data quality system 230 may determine that the data has a high, medium, or low quality based on a set of metrics related to the data satisfying various thresholds.

In some implementations, data quality system 230 may determine values for a set of metrics related to the data prior to performing other processing using the second set of techniques. In some implementations, data quality system 230 may use the values to identify a manner in which to process the data using the second set of techniques. For example, threshold values for a particular combination of metrics may indicate a particular error related to the data. Continuing with the previous example, data quality system 230 may determine to process the data using the second set of techniques in a particular manner to determine whether the error indicated by the values is included in the data. In this way, data quality system 230 may use values for a set of metrics to focus processing of the data on potential errors, potential errors associated with a threshold likelihood of being included in the data, and/or the like, thereby conserving processing resources relative to processing the data (e.g., relative to processing the data without focusing the processing on potential errors).

In some implementations, data quality system 230 may determine a manner in which to fix an error related to the data. For example, data quality system 230 may determine a manner in which to positively impact an error, reduce or eliminate an error, improve a quality of data, and/or the like. For example, data quality system 230 may determine to modify the data. Continuing with the previous example, data quality system 230 may modify a value of the data, modify a format of the data, modify data elements included in the data (e.g., obtain additional data elements, remove data elements, combine data elements, etc. included in the data). Additionally, or alternatively, and as another example, data quality system 230 may determine to replace the data, or a portion thereof (e.g., data quality system 230 may determine to replace a first data set stored on a first server device 220 with a second data set from a second server device 220).

Additionally, or alternatively, and as another example, data quality system 230 may determine to modify a file and/or type of file in which the data is stored (e.g., convert the data from a first type of file to a second type of file, rearrange columns and/or rows of a file that includes the data, etc.). In some implementations, data quality system 230 may fix the data in a determined manner. In some implementations, data quality system 230 may form processed data by fixing the data.

Additionally, or alternatively, and as another example, different intended uses of data may be associated with different tolerances related to errors included in the data. For example, different intended uses may be associated with different tolerances for threshold quantities of errors, different types of errors (e.g., formatting errors, null value errors, etc.), and/or the like. In some implementations, data quality system 230 may determine whether an identified error is to be fixed based on an intended use of the data. For example, data quality system 230 may determine to not fix an error when the error is tolerable based on an intended use of the data. This conserves processing resources of data quality system 230 by reducing or eliminating a need for data quality system 230 to fix an error.

In some implementations, data quality system 230 may output information for display via client device 210. For example, data quality system 230 may generate a report that includes information identifying a manner in which data quality system 230 has determined to fix the data and may provide the report for display via client device 210. In some implementations, data quality system 230 may request confirmation from a user of client device 210 to fix the data in a determined manner and may not fix the data until a user of client device 210 has confirmed the manner in which to modify the data. Additionally, or alternatively, data quality system 230 may receive input from a user of client device 210 to modify the data in a different manner. In this case, data quality system 230 may modify the data in the manner indicated by the input from the user of client device 210.

In this way, data quality system 230 may process the data using a second set of techniques to improve the quality of the data and to form processed data, to permit data quality system 230 to provide the processed data to the set of server devices 220 to replace the data stored in the set of server devices 220.

As further shown in FIG. 4, process 400 may include providing the processed data toward the set of server devices to replace the data stored in the set of server devices and/or toward another destination to permit the set of server devices and/or the other destination to use the processed data (block 440). For example, data quality system 230 may provide the processed data toward the set of server devices 220 to replace the data stored in the set of server devices 220 and/or toward another destination to permit the set of server devices 220 and/or the other destination to use the processed data.

In some implementations, data quality system 230 may provide the data toward server device 220 to replace the data. Additionally, or alternatively, data quality system 230 may delete data stored by server device 220 or overwrite data stored by server devices 220. Additionally, or alternatively, data quality system 230 may provide the processed data toward a destination, toward an application (e.g., hosted by server device 220, accessed by a user of client device 210, executing on client device 210, etc.), toward client device 210, and/or the like. Additionally, or alternatively, data quality system 230 may provide a set of instructions to server device 220 to modify data stored by server device 220 such that the data stored by server device 220 matches the processed data.

In this way, data quality system 230 may provide the processed data toward the set of server devices 220 to replace the data in the set of server devices 220 and/or toward another destination to permit the set of server devices 220 and/or the other destination to use the processed data, prior to performing another action related to the processed data.

As further shown in FIG. 4, process 400 may include performing an action after providing the processed data toward the set of server devices and/or the other destination (block 450). For example, data quality system 230 may perform an action after providing the processed data toward the set of server devices 220 and/or the other destination.

In some implementations, data quality system 230 may generate a report that includes information identifying a manner in which the data was fixed. Additionally, or alternatively, data quality system 230 may provide the report for display. Additionally, or alternatively, data quality system 230 may store information related to a manner in which data was fixed to improve future processing of other data (e.g., as structured data, unstructured data, machine data, etc.).

Additionally, or alternatively, data quality system 230 may provide a set of instructions to server device 220 and/or client device 210 to perform particular operations using the processed data (e.g., generate a report, process a transaction, etc.). Additionally, or alternatively, data quality system 230 may send a message to client device 210 (e.g., for display)

indicating that data quality system 230 has processed the data to form processed data. Additionally, or alternatively, data quality system 230 may schedule a meeting among employees of the organization to discuss errors in the data that data quality system 230 identified, a manner in which data quality system 230 modified the data, and/or the like. For example, data quality system 230 may access electronic calendars associated with the employees to identify an available time for a meeting and may generate a calendar item for the meeting, generate a meeting invitation for the meeting, populate a calendar with information identifying the meeting, and/or the like.

In this way, data quality system 230 may perform an action after providing the processed data to the set of server devices 220 and/or the other destination.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Figure 5:
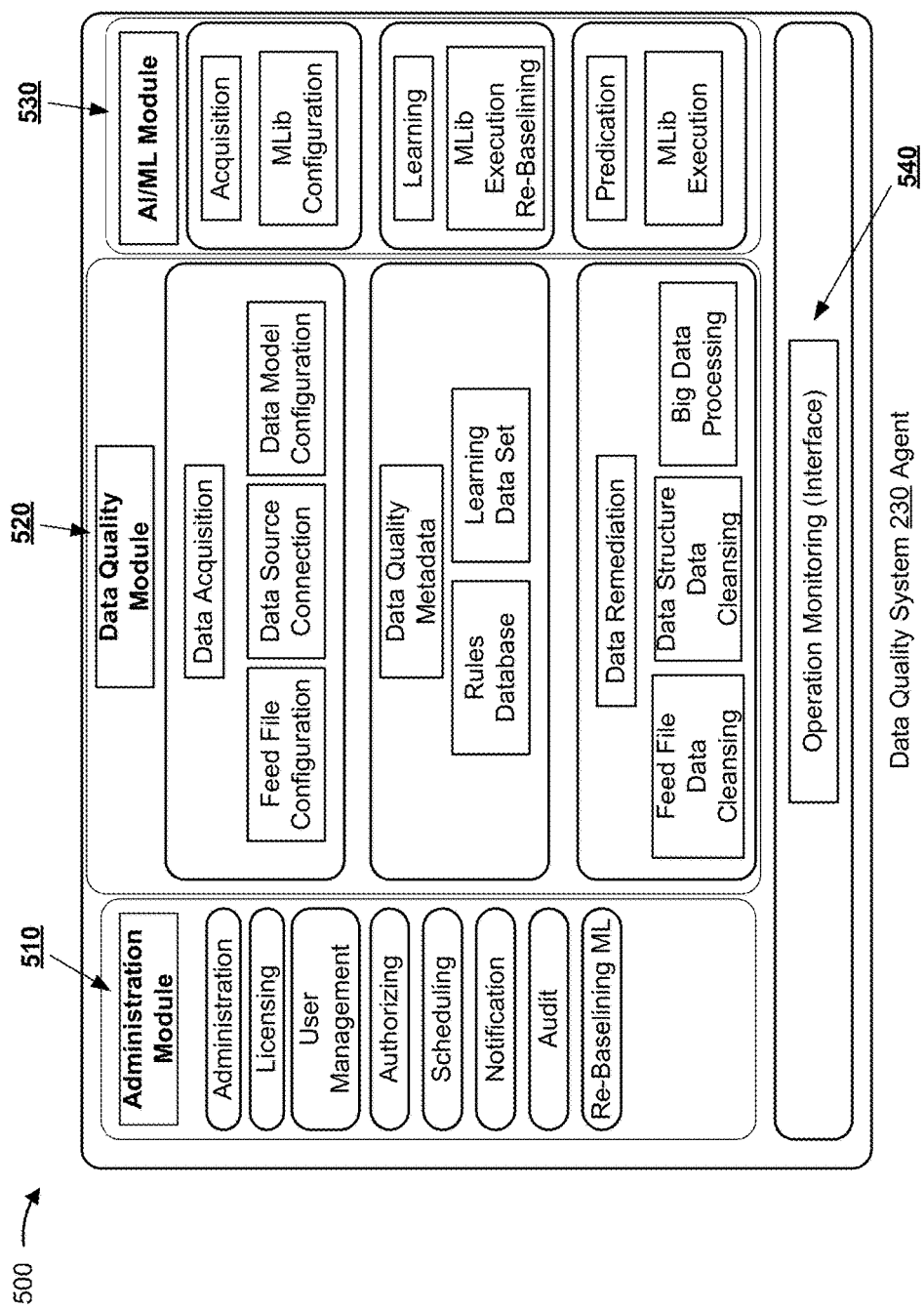
FIG. 5 is a diagram of an example implementation relating to the example process shown in FIG. 4.

FIG. 5 is a diagram of an example implementation 500 relating to the example process 400 shown in FIG. 4. FIG. 5 shows an example architecture for an agent that data quality system 230 may use to process data.

As shown in FIG. 5, and by reference number 510, the agent that data quality system 230 may use may include an administration module related to authorizing users, authorizing actions, and/or the like. For example, the administration module may perform functions such as administration-related functions, licensing, user management, authorizing, scheduling, notification, audit-related functions, and/or re-baselining of machine learning (e.g., shown as "Re-Baselining ML") where, for example, machine learning that data quality system 230 implements is updated based on new training data.

As shown by reference number 520, the agent that data quality system 230 may use may include a data quality module related to receiving and processing data to identify an error related to the data, to fix the data, and/or the like. For example, the data quality module may perform functions related to data acquisition. Continuing with the previous example, data quality system 230 may configure a feed file (shown as "Feed File Configuration") (e.g., a file that data quality system 230 receives from server device 220 that includes data to be processed), establishing various connections with a data source (shown as "Data Source Connection") (e.g., using Java database connectivity (JDBC), open database connectivity (ODBC), etc.), configuring a data model (shown as "Data Model Configuration") (e.g., configuring a data model to process data for a particular use, from a particular source and/or destination, etc.), and/or the like.

Additionally, or alternatively, and as another example, the data quality module may perform functions related to receiving metadata related to data quality (shown as "Data Quality Metadata"). Continuing with the previous example, the data quality module may receive data from a rules database that identifies a set of rules to be used to process data (shown as "Rules Database"), data related to a learning data set that data quality system 230 is to use to determine whether other data contain errors (shown as "Learning Data Set"), and/or the like.

Additionally, or alternatively, and as another example, the data quality module may perform functions related to data remediation and/or fixing the data (shown as "Data Remediation"). Continuing with the previous example, data quality system 230 may fix data included in a feed file (shown as "Feed File Data Cleansing"), fix data included in a data structure (shown as "Data Structure Data Cleansing"), and/or process the data using a big data technique (shown as "Big Data Processing") (e.g., to identify trends or patterns among data, to process millions, billions, trillions, etc. of data elements, etc.), and/or the like.

As shown by reference number 530, data quality system 230 may include an artificial intelligence and/or machine learning module (shown as "AI/ML Module") that performs artificial intelligence and/or machine learning functions when processing data. For example, the AI/ML module may acquire data to permit data quality system 230 to be trained for artificial intelligence and/or machine learning purposes (shown as "Acquisition") (e.g., acquiring and/or configuring a machine learning library (MLib) (shown as "MLib Configuration")), performing machine learning (e.g., training data quality system 230, re-baselining MLib execution based on new training data and/or changes to features that data quality system 230 is to identify (shown as "MLib Execution Re-baselining"), etc.), performing predication via MLib execution (shown as "MLib Execution") (e.g., identifying a data set that may contain an error), and/or the like.

As shown by reference number 540, the agent that data quality system 230 may use may include an interface (e.g., an operation monitoring interface, show as "Operation Monitoring (Interface)"). In some implementations, for example, the interface may permit the agent to monitor operations of the system to which processed data is provided to permit data quality system 230 to determine whether the processed data fixes an error in operation of the system, to determine metrics related to operation of the system, and/or the like.

As indicated above, FIG. 5 is provided merely as an example. Other examples are possible and may differ from what was described with regard to FIG. 5.

Figure 6:
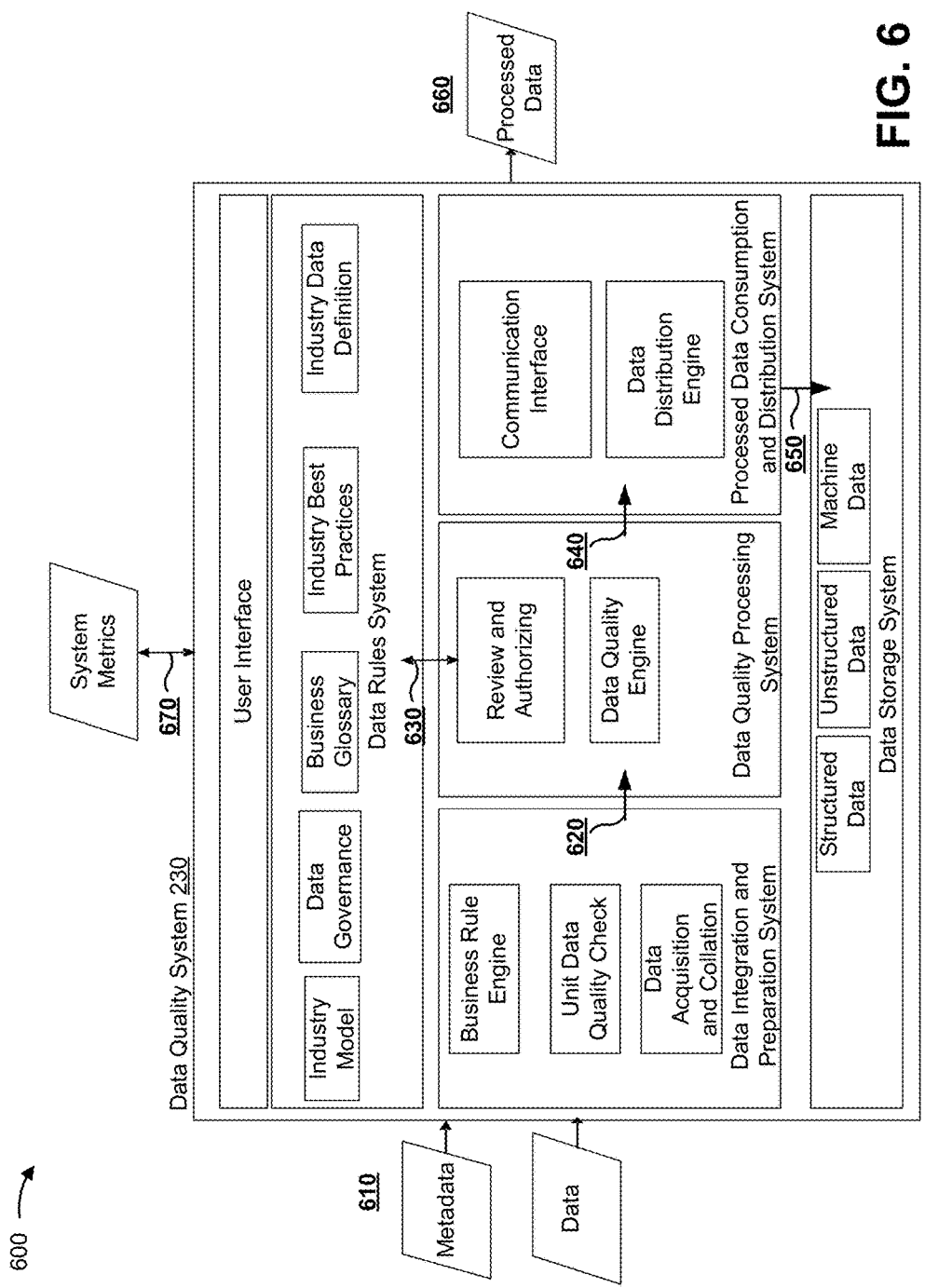
FIG. 6 is a diagram of an example implementation relating to the example process shown in FIG. 4.

FIG. 6 is a diagram of an example implementation 600 relating to the example process 400 shown in FIG. 4. FIG. 6 shows an example architecture for data quality system 230 and an example process that data quality system 230 may use to process data to determine whether the data contains an error.

As shown by reference number 610, data quality system 230 may receive data and/or metadata related to the data to be processed by data quality system 230. For example, data quality system 230 may receive the data and/or the metadata from server device 220, client device 210, an application, a system, and/or the like. Data quality system 230 may receive the data using a first system (e.g., a data integration and preparation system). The first system may include a set of modules (e.g., shown as "Business Rule Engine" "Unit Data Quality Check," and "Data Acquisition and Collation") to perform functions similar to that described above with respect to block 420 in FIG. 4. For example, the first system may pre-process data and/or metadata to permit data quality system 230 to process the data and/or metadata to improve a quality of the data and/or metadata.

As shown by reference number 620, the first system may provide the data and/or the metadata to a second system (e.g., a data quality processing system). The second system may include a set of modules (e.g., shown as "Review and Authorizing" and "Data Quality Engine") to perform functions similar to that described above with respect to block 430 in FIG. 4 (e.g., to form processed data). For example, the second system may process the data and/or the metadata to determine whether the data and/or the metadata contains an error. As shown by reference number 630, when processing the data and/or the metadata, the second system may communicate with a third system (e.g., a data rules system) to receive information identifying a set of rules that is to be used to determine whether the data and/or the metadata contains an error. As further shown in FIG. 6, data quality system 230 may include a user interface (e.g., a dashboard) that data quality system 230 may use to provide information for display that indicates errors identified in the data and/or metadata, a manner which data quality system 230 determines to fix the data and/or the metadata, and/or the like.

As shown by reference number 640, the second system may provide processed data to a fourth system (e.g., a processed data consumption and distribution system). In some implementations, the fourth system may include a set of modules (e.g., shown as "Data Distribution Engine") and a set of interfaces (e.g., shown as "Communication Interface") to perform functions similar to that described above with respect to block 440 in FIG. 4. For example, and as shown by reference number 650, the fourth system may provide the processed data to a fifth system (e.g., a data storage system) to store the data (e.g., for tracking purposes, to improve future uses of machine learning, etc.). The fifth system may store the processed data as structured data, unstructured data, machine data, and/or the like.

Additionally, or alternatively, and as shown by reference number 660, the fourth system may provide the processed data to a sixth system that is to use the processed data to implement a process of an organization. The fourth system may provide the processed data to the sixth system to replace data stored in the sixth system that contains errors. As shown by reference number 670, data quality system 230 may communicate with the sixth system to determine metrics related to use of the processed data by the sixth system (e.g., to determine whether use of the processed data fixes an error related to operations of the sixth system).

As indicated above, FIG. 6 is provided merely as an example. Other examples are possible and may differ from what was described with regard to FIG. 6.

Some implementations, described herein, provide a data quality system that is capable of receiving data from a source (e.g., a system), fixing a data quality problem associated with the data, and replacing data in the source with the fixed data. In this way, the data quality system may update data at a source of the data so that the data does not need to be fixed each time the data is used. This conserves processing resources of hardware resources of an organization by reducing or eliminating a need to fix the data each time the data is used. In addition, this conserves processing resources of hardware resources that use the data by reducing or eliminating errors during use of the data that would otherwise consume processing resources through use of error-containing data, that would otherwise be consumed reprocessing data because of processing errors that resulted from using error-containing data, and/or the like. Further, this increases an efficiency of using data from a source by reducing an amount of time between when data is received from the source and when the data can be used (e.g., to generate a report, to implement a particular process, etc.).

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A first device, comprising:
one or more processors to:
receive data from a set of second devices to be processed to determine a quality of the data,
the data including:
first data stored by the set of second devices,
second data provided toward a third device, or
third data related to fourth data;
process the data using a first set of techniques to prepare the data for processing related to improving the quality of the data;
process the data using a second set of techniques to improve the quality of the data and to form processed data,
the processed data to be used or stored by the set of second devices;
provide the processed data toward the set of second devices to replace the data stored by the set of second devices or toward another destination to permit the set of second devices or the other destination to use the processed data,
the processed data being provided toward the set of second devices to improve the quality of the data stored by the set of second devices; and perform an action after providing the processed data toward the set of second devices or the other destination.

2. The first device of claim 1, where the one or more processors are further to:
monitor operations of the set of second devices;
identify another error related to the operations of the set of second devices; and
where the one or more processors, when receiving the data, are to:
receive the data from the set of second devices based on identifying the other error related to the operations of the set of second devices.

3. The first device of claim 1, where the first set of techniques includes:
aggregating the data,
deduplicating the data,
formatting the data, or
fixing corrupted data elements included in the data.

4. The first device of claim 1, where the one or more processors, when processing the data using the first set of techniques, are to:
process the data based on an intended use of the data,
the intended use being determined from the data or from information received from the third device that identifies the intended use of the data.

5. The first device of claim 1, where the one or more processors are further to:
identify a set of rules to be used to determine the quality of the data; and
where the one or more processors, when processing the data using the second set of techniques, are to:
process the data using the set of rules based on identifying the set of rules.

6. The first device of claim 1, where the one or more processors, when processing the data using the second set of techniques, are to:
determine whether the data satisfies a set of rules to determine the quality of the data.

7. The first device of claim 1, where the one or more processors are further to:
determine a manner in which to fix the data to improve the quality of the data;
perform one or more actions to fix the data based on determining the manner in which to fix the data,
the one or more actions forming the processed data; and
where the one or more processors, when providing the processed data, are to:
provide the processed data toward the set of second devices after performing the one or more actions.

8. A method, comprising:
receiving, by a first device, data from a set of second devices to be processed to determine whether the data includes an error,
the data including:
first data stored by the set of second devices,
second data provided toward a third device, or
third data related to fourth data;
processing, by the first device, the data using a first set of techniques to prepare the data for processing related to determining whether the data includes the error;
processing, by the first device, the data using a second set of techniques to positively impact the error and to form processed data,
the processed data to be used or stored by the set of second devices;
providing, by the first device, the processed data toward the set of second devices to positively impact the error by replacing the data stored in the set of second devices or toward another destination to permit the set of second devices or the other destination to use the processed data; and
performing, by the first device, an action after providing the processed data toward the set of second devices or the other destination.

9. The method of claim 8, where processing the data using the first set of techniques comprises:
processing the data based on an intended use of the data.

10. The method of claim 8, further comprising:
determining a profile of the data; and
where processing the data using the second set of techniques comprises:
processing the data using the second set of techniques based on the profile of the data.

11. The method of claim 8, where processing the data using the second set of techniques comprises:
processing the data using machine learning to determine whether the data includes the error.

12. The method of claim 8, further comprising:
determining values for a set of metrics based on a result of processing the data using the second set of techniques; and
determining a manner in which to fix the error based on the values for the set of metrics.

13. The method of claim 8, further comprising:
determining a set of rules to use to process the data using machine learning; and
where processing the data using the second set of techniques comprises:
processing the data using the set of rules.

14. The method of claim 8, further comprising:
determining a manner in which to fix the data to positively impact the error based on an intended use of the data;
performing one or more actions to fix the error based on determining the manner in which to fix the error; and
where providing the processed data toward the set of second devices comprises:
providing the processed data toward the set of second devices after performing the one or more actions.

15. A non-transitory computer-readable medium storing instructions, the instructions comprising:
one or more instructions that, when executed by one or more processors, cause the one or more processors to:
receive data from a set of first devices,
the data to be processed to determine whether the data includes an error;
process the data using a first set of techniques to permit a second device to determine whether the data includes the error;
process the data using a second set of techniques related to determining whether the data includes the error,
the second set of techniques to be used to form processed data;
determine whether the data includes the error based on a result of processing the data using the second set of techniques;
provide the processed data toward the set of first devices to replace the data stored by the set of first devices or toward another destination,
the processed data being provided toward the set of first devices to positively impact the error included in the data; and perform an action after providing the processed data toward the set of first devices or the other destination.

16. The non-transitory computer-readable medium of claim 15, where the one or more instructions, when executed by the one or more processors, further cause the one or more processors to:
   determine an intended use of the data; and
   where the one or more instructions, that cause the one or more processors to process the data using the second set of techniques, cause the one or more processors to:
      process the data using the second set of techniques based on the intended use of the data.

17. The non-transitory computer-readable medium of claim 15, where the one or more instructions, when executed by the one or more processors, further cause the one or more processors to:
   determine a profile for the data by processing at least one of:
      other data stored by the set of first devices,
      information identifying a manner in which a user of a third device interacts with the data, or
      information identifying a topic or a domain associated with the data; and
   where the one or more instructions, that cause the one or more processors to process the data using the second set of techniques, cause the one or more processors to:
      process the data using the second set of techniques after determining the profile of the data.

18. The non-transitory computer-readable medium of claim 15, where the one or more instructions, that cause the one or more processors to process the data using the second set of techniques, cause the one or more processors to:
   process the data using machine learning to determine whether the data includes the error.

19. The non-transitory computer-readable medium of claim 15, where the one or more instructions, when executed by the one or more processors, further cause the one or more processors to:
   determine values for a set of metrics related to the data; and
   where the one or more instructions, that cause the one or more processors to process the data using the second set of techniques, cause the one or more processors to:
      process the data using the second set of techniques based on the values for the set of metrics.

20. The non-transitory computer-readable medium of claim 19, where the one or more instructions, when executed by the one or more processors, further cause the one or more processors to:
   identify the error based on the values for the set of metrics;
   determine a manner in which to process the data using the second set of techniques; and
   where the one or more instructions, that cause the one or more processors to process the data using the second set of techniques, cause the one or more processors to:
      process the data using the second set of techniques after determining the manner in which to process the data to fix the error.

* * * * *